(12) United States Patent
Jia et al.

(10) Patent No.: US 10,607,524 B2
(45) Date of Patent: Mar. 31, 2020

(54) DISPLAY SUBSTRATE AND DISPLAY PANEL

(71) Applicant: BOE TECHNOLOGY GROUP CO., LTD., Beijing (CN)

(72) Inventors: Yanan Jia, Beijing (CN); Xue Dong, Beijing (CN); Jing Lv, Beijing (CN); Haisheng Wang, Beijing (CN); Chunwei Wu, Beijing (CN); Xiaoliang Ding, Beijing (CN); Pengpeng Wang, Beijing (CN); Yuzhen Guo, Beijing (CN); Wei Liu, Beijing (CN); Rui Xu, Beijing (CN); Lijun Zhao, Beijing (CN); Yanling Han, Beijing (CN); Changfeng Li, Beijing (CN); Yingming Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/544,782

(22) PCT Filed: Jan. 19, 2017

(86) PCT No.: PCT/CN2017/071683
§ 371 (c)(1),
(2) Date: Jul. 19, 2017

(87) PCT Pub. No.: WO2017/206526
PCT Pub. Date: Dec. 7, 2017

(65) Prior Publication Data
US 2018/0277033 A1    Sep. 27, 2018

(30) Foreign Application Priority Data
Jun. 3, 2016  (CN) .................... 2016 2 0537196 U

(51) Int. Cl.
G09G 3/20      (2006.01)
G06F 3/01      (2006.01)
(Continued)

(52) U.S. Cl.
CPC ........... G09G 3/2003 (2013.01); G06F 3/013 (2013.01); G09G 3/3225 (2013.01);
(Continued)

(58) Field of Classification Search
CPC .... G09G 3/2003; G09G 3/3225; G09G 3/002; G06F 3/013
See application file for complete search history.

(56) References Cited

U.S. PATENT DOCUMENTS 8,928,585 B2     1/2015  Mondragon et al.
9,530,381 B1 *  12/2016  Bozarth .............. H05B 37/02
(Continued)

FOREIGN PATENT DOCUMENTS

CN    103782255 A    5/2014
CN    105094300 A   11/2015
(Continued)

OTHER PUBLICATIONS

International Search Report and Written Opinion, for PCT Patent Application No. PCT/CN2017/071683, dated Apr. 11, 2017, 16 pages.

*Primary Examiner* — Kevin M Nguyen
(74) *Attorney, Agent, or Firm* — Kinney & Lange, P.A.

(57) ABSTRACT

A display panel has a light exit side and includes an infrared light emitting unit for emitting infrared light towards the light exit side of the display panel; and at least three infrared light sensing units provided at different positions for detecting intensity of the infrared light emitted from the light exit side of the display panel and reflected by a human eye.

6 Claims, 4 Drawing Sheets

(51) Int. Cl.
*G09G 3/3225* (2016.01)
*H01L 27/32* (2006.01)
*G09G 3/3208* (2016.01)

(52) U.S. Cl.
CPC ....... *H01L 27/3234* (2013.01); *G09G 3/3208* (2013.01); *G09G 2320/0261* (2013.01); *G09G 2360/145* (2013.01)

(56) References Cited

U.S. PATENT DOCUMENTS

| | | |
|---|---|---|
| 2008/0121442 A1* | 5/2008 | Boer ................... G06F 3/0412 178/18.09 |
| 2009/0231511 A1 | 9/2009 | Takahashi et al. |
| 2013/0094712 A1 | 4/2013 | Said |
| 2015/0015478 A1 | 1/2015 | Hoffman |
| 2015/0199006 A1* | 7/2015 | He ......................... G06F 3/013 345/158 |
| 2015/0223684 A1 | 8/2015 | Hinton |
| 2017/0039904 A1* | 2/2017 | Jepsen ............... G02B 27/0172 |

FOREIGN PATENT DOCUMENTS

| | | |
|---|---|---|
| CN | 205657058 A | 10/2016 |
| CN | 205657058 U | 10/2016 |

* cited by examiner ical Field

Embodiments of the present disclosure relate to a field of display technology, and more particularly, to a display substrate and a display panel.

Description of the Related Art

Some display devices have a function of eye locating (or eye tracking) in order to obtain an eye location of a viewer in real time and adjust a display according to the obtained eye location for a better usage experience.

SUMMARY

According to an aspect of the present disclosure, there is provided a display panel having a light exit side, wherein the display panel comprises:

an infrared light emitting unit for emitting infrared light towards the light exit side of the display panel; and at least three infrared light sensing units provided at different positions for detecting intensity of the infrared light emitted from the light exit side of the display panel and reflected by a human eye.

According to an exemplary embodiment, the display panel comprises a plurality of infrared light emitting units provided at different positions.

According to an exemplary embodiment, the infrared light emitting unit is a pulse infrared light emitting unit for emitting pulsed infrared light.

According to an exemplary embodiment, the display panel comprises a display area and a peripheral area surrounding the display area, the display area being provided with a plurality of pixel units spaced apart from each other.

According to an exemplary embodiment, the infrared light emitting unit is arranged in the display area, and the infrared light sensing unit is arranged in the peripheral area; or the infrared light emitting unit is arranged in the peripheral area, and the infrared light sensing unit is arranged in the display area.

According to an exemplary embodiment, at least portion of the infrared light emitting units and/or the infrared light sensing units are arranged in the display area, and the infrared light emitting unit and/or the infrared light sensing unit arranged in the display area are located at an interval between adjacent pixel units.

According to an exemplary embodiment, a black matrix is provided at a side of the infrared light emitting unit and/or the infrared light sensing unit arranged in the display area adjacent to the light exit side.

According to an exemplary embodiment, the display panel is a light emitting diode display panel, and the infrared light emitting unit is an infrared light emitting diode provided in the display area.

According to another aspect of the present disclosure, there is provided a display substrate having a light exit side, wherein the display substrate comprises:

an infrared light emitting unit for emitting infrared light towards the light exit side of the display substrate; and at least three infrared light sensing units provided at different positions for detecting intensity of the infrared light emitted from the light exit side of the display substrate and reflected by a human eye.

According to an exemplary embodiment, the display substrate is an array substrate.

DETAILED DESCRIPTION OF PREFERRED EMBODIMENTS

In order to provide a better understanding of the technical solutions of the present disclosure for those skilled in the art, the present disclosure will be described in further detail with reference to the accompanying drawings and specific embodiments below.

Figure 1:
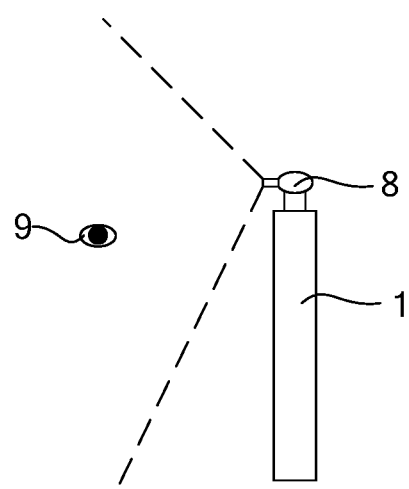
FIG. 1 is a schematic structural side view of a display device having a function of eye locating.

As shown in FIG. 1, a display device having a function of eye locating is provided with a camera 8 on a display panel 1, an image in front of the display panel 1 is acquired by the camera 8, and an eye 9 is recognized from the image by an image analysis technique so as to determine its spatial location.

The image obtained by the above method has a large amount of information, so it needs a complex operation to locate the eye, thus it has a large amount of computation, high cost and low accuracy.

Figure 2:
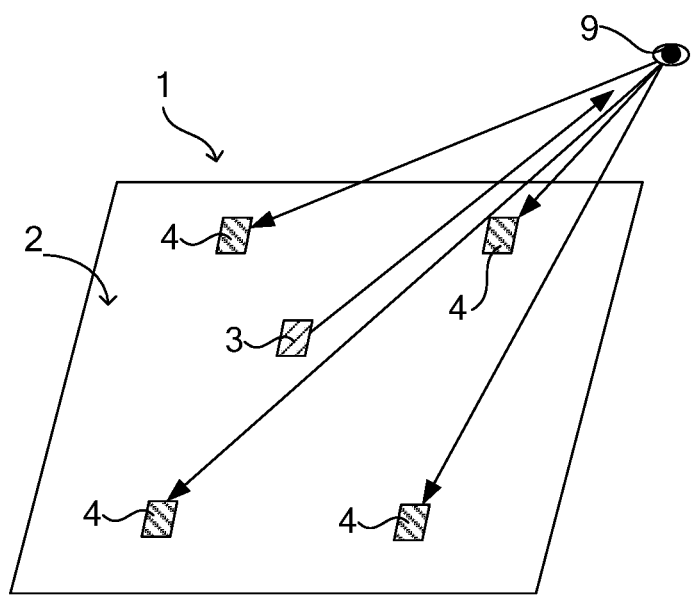
FIG. 2 is a schematic view showing a principle of eye locating of a display panel according to an embodiment of the present disclosure.

In order to at least partially solve the problem that the eye locating technique has a large amount of computation, high cost and low accuracy, as shown in FIG. 2, according to an embodiment of the present disclosure, there is provided a display panel 1 having a light exit side 2, wherein the display panel 1 includes an infrared light emitting unit 3 for emitting infrared light towards the light exit side 2 of the display panel 1; and at least three infrared light sensing units 4 provided at different positions for detecting intensity of the infrared light emitted from the light exit side 2 of the display panel 1 and reflected by a human eye 9. The display panel 1 of this embodiment can be used for displaying. One side of the display panel functions as a light exit side 2 at which the light for displaying is emitted, and the infrared light emitting unit 3 included in the display panel 1 is used for emitting infrared light and the infrared light sensing unit 4 included in the display panel 1 is used for detecting intensity of the infrared light.

Figure 5:
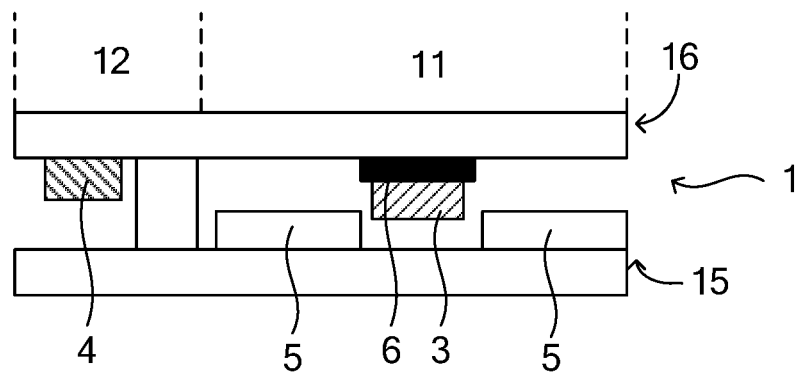
FIG. 5 is a schematic structural view of the display panel in partial cross section along a line A-A of FIG. 4.
Figure 7:
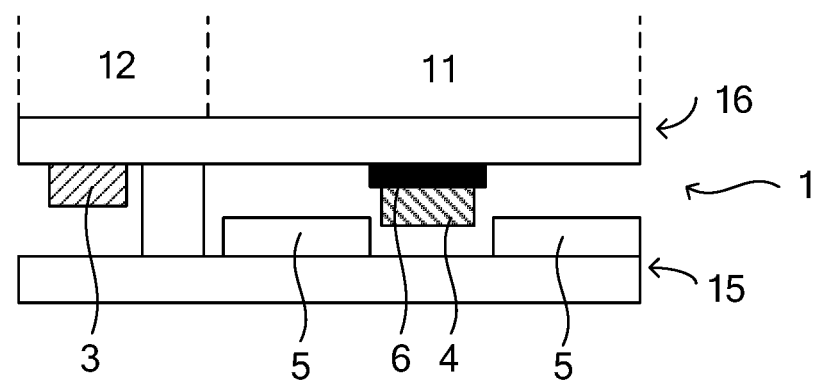
FIG. 7 is a schematic structural view of the display panel in partial cross section along a line B-B of FIG. 6.

Specifically, as shown in FIG. 5 or 7, the display panel 1 may be formed by assembling two substrates, such as an array substrate 15 and a substrate 16 to be assembled. The infrared light emitting unit 3 and the infrared light sensing unit 4 may be integrated in one or both of the two substrates, so that they are perfectly integrated with the display panel 1, thereby achieving a high integration level. Of course, the infrared light emitting unit 3 and the infrared light sensing unit 4 may also be connected to the array substrate 15 or the substrate 16 to be assembled for example by adhesives, or arranged on a frame of the display panel 1, or the like.

In comparison with most articles in daily life, the eye 9 has a very strong reflecting ability to the infrared light. Therefore, as shown in FIG. 2, the infrared light emitted from the infrared light emitting unit 3 is mainly reflected back by the eye 9 and passes onto the infrared light sensing unit 4. Thus, the intensity of the infrared light received by the infrared light sensing unit 4 is related to a distance between the infrared light sensing unit 4 and the eye 9. Therefore, the distance between the eye 9 and the infrared light sensing unit 4 may be determined by analyzing a detection result from the infrared light sensing unit 4, and a spatial location of the eye 9 relative to the display panel 1 may be determined according to the distances between the eye 9 and the plurality of infrared light sensing units 4. Thus, it can achieve the locating or tracking of the eye 9.

In the display panel 1 of this embodiment, the location of the eye 9 may be determined by the intensity of the infrared light reflected by the eye 9, therefore it does not need complicated image processing, and has a small amount of computation, low cost, and high location accuracy.

Of course, in general, the infrared light is reflected by both (or two) eyes of the same person at the same time. However, since a distance between the two eyes is much smaller than a distance between the eyes 9 and the display panel 1, and the distance between two eyes of each person is in a substantially range, two eyes for the same person can be approximately considered as one reflection point to calculate the location thereof.

Although only one infrared light emitting unit 3 is shown in FIG. 2, the present disclosure is not limited thereto. According to a further embodiment, a plurality of infrared light emitting units 3 may be provided, and may be arranged at different positions.

Figure 4:
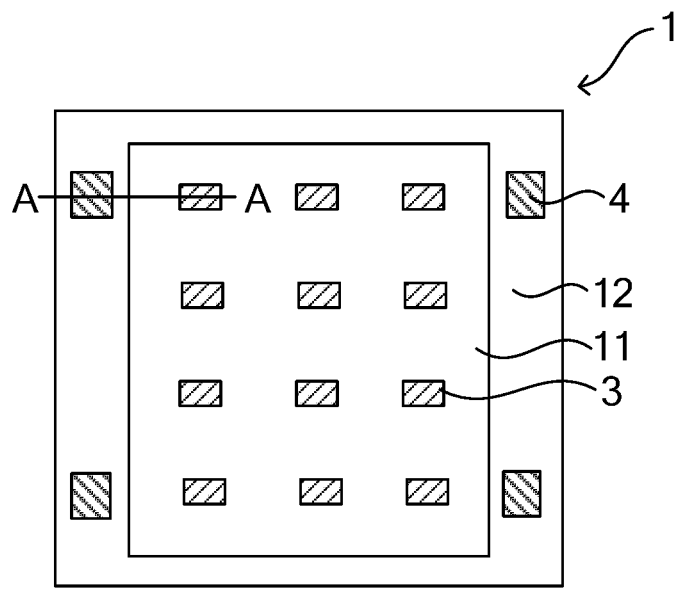
FIG. 4 is a schematic structural top view of a display panel according to an embodiment of the present disclosure.
Figure 6:
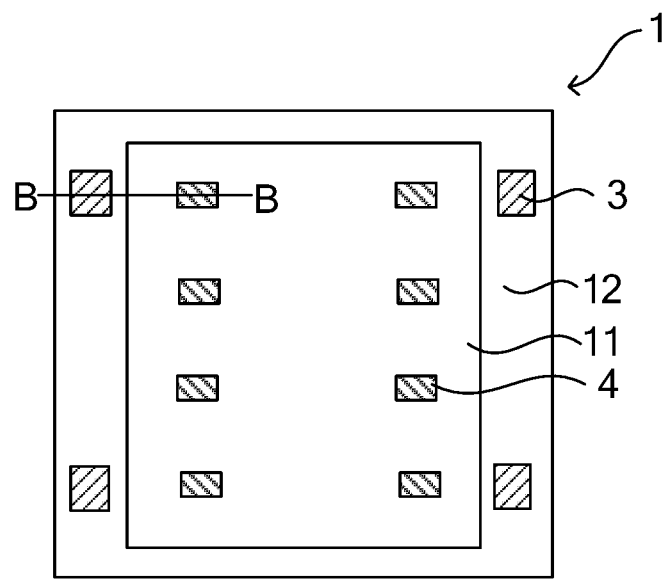
FIG. 6 is a schematic structural top view of another display panel according to an embodiment of the present disclosure.

Specifically, as shown in FIGS. 4 and 6, there are a plurality of infrared light emitting units 3 arranged at different positions. If there is only one infrared light emitting unit 3 and the one infrared light emitting unit 3 is shielded, then it is difficult to detect the location of the eye due to weak intensity of the infrared light emitted into the eye 9. In contrast, if a plurality of infrared light emitting units 3 are provided, then it can ensure that the eye 9 can receive stable infrared light in a variety of different circumstances.

According to an embodiment, the infrared light emitting unit 3 is a pulse infrared light emitting unit for emitting pulsed infrared light.

Figure 3:
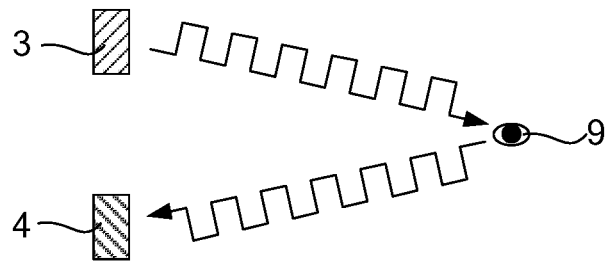
FIG. 3 is a schematic view showing a principle of eye locating of another display panel according to an embodiment of the present disclosure.

Specifically, as shown in FIG. 3, the infrared light emitting unit 3 is intended to generate pulsed infrared light. Accordingly, the infrared light sensing unit 4 receives the infrared light which is in the form of a pulse. In this way, by analyzing the number of pulses, the time, the phase, and the like of the infrared light received by the infrared light sensing unit 4, it is possible to more accurately determine the distance between the infrared light sensing unit 4 and the eye 9, and further achieve a more accurate location of the eye 9.

For example, the infrared light emitting unit 3 may intermittently transmit a square-wave pulsed infrared light of, for example, 100 square-wave pulses each transmission. Since a certain amount of time is needed for the infrared light to be reflected to the infrared light sensing unit 4, the infrared light sensing unit 4 should receive only a part of the pulses when the infrared light emitting unit 3 stops emitting the infrared light. For example, 98 square-wave pulses may be received. Moreover, the difference of the number of the pulses is determined by a length of a propagation path of the infrared light. Therefore, the distance between the eye 9 and the infrared light sensing unit 4 can be obtained by analyzing it.

FIG. 4 is a schematic structural top view of a display panel according to an embodiment of the present disclosure, and FIG. 5 is a schematic structural view of the display panel in partial cross section along a line A-A of FIG. 4. As shown in FIGS. 4-5, the display panel 1 includes a display area 11 and a peripheral area 12 surrounding the display area 11, and the display area 11 is provided with a plurality of pixel units 5 spaced apart from each other.

Specifically, the display panel 1 may include a display area 11 for displaying in the middle of the display panel and a peripheral area 12 (for example, a frame or the like) which is not used for displaying, surrounding the display area 11, and display area 11 includes a plurality of pixel units 5 for displaying in the display area 11.

As shown in FIG. 4, the infrared light emitting unit 3 is arranged in the display area 11, and the infrared light sensing unit 4 is arranged in the peripheral area 12.

FIG. 6 is a schematic structural top view of another display panel according to an embodiment of the present disclosure, and FIG. 7 is a schematic structural view of the display panel in partial cross section along a line B-B of FIG. 6. As shown in FIGS. 6-7, the display panel 1 includes a display area 11 and a peripheral area 12 surrounding the display area 11, and the display area 11 is provided with a plurality of pixel units 5 spaced apart from each other.

As shown in FIG. 6, the infrared light emitting unit 3 is arranged in the peripheral area 12, and the infrared light sensing unit 4 is arranged in the display area 11.

In order to avoid interference between the infrared light emitting unit 3 and the infrared light sensing unit 4 caused by too small of a distance, the infrared light emitting unit 3 may be arranged in the display area 11 and the infrared light sensing unit 4 may be arranged in the peripheral area 12, as shown in FIGS. 4-5, or alternatively, the infrared light emitting unit 3 may be arranged in the peripheral area 12 and the infrared light sensing unit 4 may be arranged in the display area 11, as shown in FIGS. 6-7. In general, the infrared light emitting unit 3 and the infrared light sensing unit 4 are respectively arranged in different areas of the display panel, for example, the infrared light emitting unit 3 and the infrared light sensing unit 4 may be respectively arranged in different sub-regions of the display area 11 or the peripheral area 12.

According to a further embodiment, at least a portion of the infrared light emitting units 3 and/or the infrared light sensing units 4 are arranged in the display area 11, and the infrared light emitting unit 3 and/or the infrared light sensing unit 4 arranged in the display area 11 are located at an interval between adjacent pixel units 5. The meaning of the expression "at least a portion of the infrared light emitting units 3 and/or the infrared light sensing units 4 are arranged in the display area 11" refers to at least one infrared light emitting unit 3 being arranged in the display area 11, or at least one infrared light sensing unit 4 being arranged in the display area 11, or at least one infrared light emitting unit 3 and at least one infrared light sensing unit 4 being arranged in the display area 11.

That is to say, as shown in FIG. 5 or 7, if the infrared light emitting unit 3 or the infrared light sensing unit 4 is arranged in the display area 11, then it should be arranged at the respective interval between the adjacent pixel units 5, so as to avoid adversely affecting the display.

Figure 8:
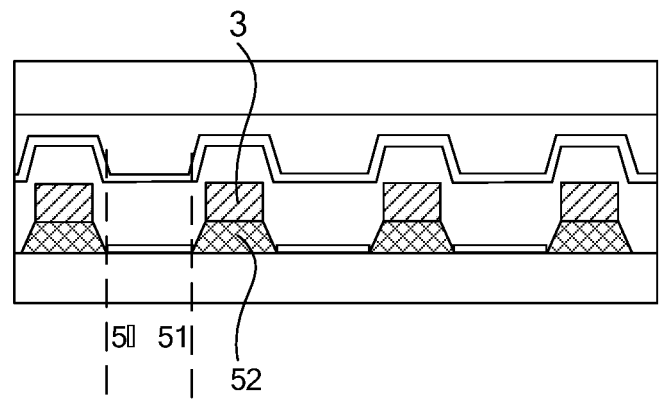
FIG. 8 is a schematic view showing a structure in partial cross section of a further display panel according to an embodiment of the present disclosure.

As shown in FIG. 8, taking an organic light emitting diode (OLED) display panel as an example, each of the pixel units 5 is provided with one organic light emitting diode 51 for emitting light, a pixel definition layer (PDL) 52 is formed between the respective pixel units 5. Therefore, if the infrared light emitting unit 3 is arranged in the display area 11, then it should be located at the pixel definition layer 52, for example, it is arranged on the pixel definition layer 52.

Further, as shown in FIG. 5 or 7, a black matrix 6 may be provided at a side of the infrared light emitting unit 3 and/or the infrared light sensing unit 4 arranged in the display area 11 adjacent to the light exit side.

That is to say, as shown in FIG. 5 or 7, as for the infrared light emitting unit 3 or the infrared light sensing unit 4 arranged in the display area 11, a black matrix 6 may be provided at a side thereof close to the light exit side of the display panel 1. The provision of the black matrix 6 may better avoid an adverse influence of the infrared light emitting unit 3 or the infrared light sensing unit 4 on the display. Additionally, because the infrared light is different from visible light, it can transmit through the black matrix 6, therefore, the provision of the black matrix 6 would not adversely affect the transmission of the infrared light.

According to an embodiment, the display panel 1 shown in FIG. 4 may be a light emitting diode display panel, and the infrared light emitting unit 3 may be an infrared light emitting diode provided in the display area 11.

According to this embodiment, in the light emitting diode display panel, each pixel unit 5 implements display by means of the light emitting diode. If the infrared light emitting unit is an infrared light emitting diode having a similar structure, then partial structures of the two kinds of diodes may be arranged in the same layer, for example, cathodes or anodes thereof are arranged in the same layer, but light emitting layers are made from different materials. In this way, it can simplify the production process and structure of the product.

The above light emitting diodes may include a quantum dot light emitting diode (QLED) and an organic light emitting diode 51 (OLED), etc., and the infrared light emitting diode may be different from the light emitting diode for displaying in terms of kinds or types, which will not be described in detail herein.

The display panel according to the above embodiments of the present disclosure includes an infrared light emitting unit and an infrared light sensing unit. Since the eye has a stronger reflection ability to the infrared light, the intensity of the infrared light received by the infrared light sensing unit is related to a distance between the infrared light sensing unit and the eye. Therefore, the location of the eye may be determined by analyzing the intensity of the infrared light received by the infrared light sensing unit. Since the display panel determines the location of the eye by the intensity of the infrared light reflected by the eye, it does not need a complicated image processing, and it has a small amount of computation, low cost, and high location accuracy.

Figure 9:
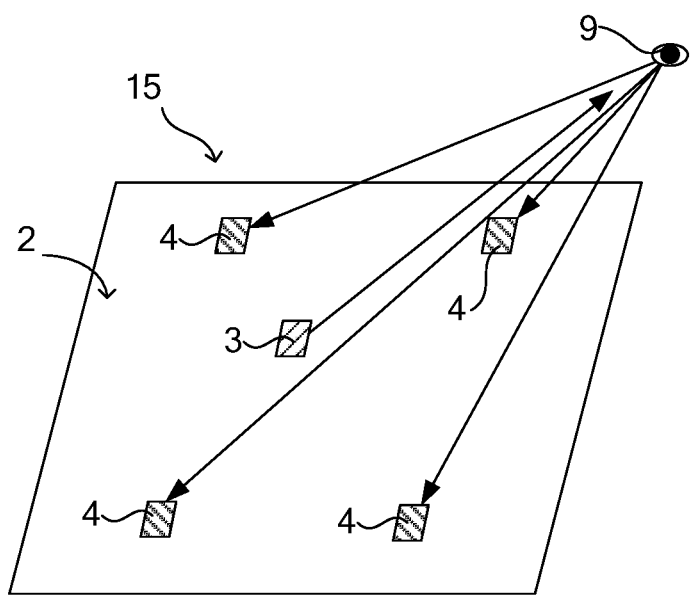
FIG. 9 is a schematic view showing a principle of eye locating of a display substrate according to an embodiment of the present disclosure.

According to another aspect of the present disclosure, as shown in FIG. 9, there is provided a display substrate 15 having a light exit side 2, wherein the display substrate includes an infrared light emitting unit 3 for emitting infrared light towards the light exit side 2 of the display substrate 15; and at least three infrared light sensing units 4 provided at different positions for detecting intensity of the infrared light emitted from the light exit side 2 of the display substrate and reflected by a human eye 9.

That is to say, the infrared light emitting unit 3 and the infrared light sensing unit 4 in the display panel 1 according to the above embodiments may be arranged in a same one display substrate 15.

According to an embodiment, the display substrate 15 may be an array substrate. That is to say, if the infrared light emitting unit 3 and the infrared light sensing unit 4 are arranged in the same one substrate, then the substrate may be an array substrate. Since the array substrate is inherently provided with a lot of leads, electrodes, etc., it is relatively convenient to incorporate the infrared light emitting unit 3, the infrared light sensing unit 4, and the like into the array substrate, which is easy to be implemented.

It should be understood that the above embodiments are merely exemplary embodiments for illustrating the principles of the present disclosure, however, the present disclosure is not limited thereto. It will be apparent to those skilled in the art that various modifications and improvements can be made without departing from the principle and spirit of the present disclosure, and such modifications and improvements shall fall within the scope of the present disclosure.

What is claimed is:

1. A display panel having a light exit side, wherein the display panel comprises:
   an infrared light emitting unit for emitting infrared light towards the light exit side of the display panel; and
   at least three infrared light sensing units provided at different positions for detecting intensity of the infrared light emitted from the light exit side of the display panel and reflected by a human eye,
   wherein the display panel further comprises a display area and a peripheral area surrounding the display area, the display area being provided with a plurality of pixel units spaced apart from each other,
   wherein the infrared light emitting unit is arranged in the display area, and the infrared light sensing units are arranged in the peripheral area,
   wherein the infrared light emitting unit arranged in the display area is located at an interval between adjacent pixel units,
   wherein a black matrix is provided at a side of the infrared light emitting unit arranged in the display area adjacent to the light exit side,
   wherein the display panel is a light emitting diode display panel, and the infrared light emitting unit is an infrared light emitting diode provided in the display area,
   wherein each of the pixel units is provided with one light emitting diode for emitting light, a pixel definition layer is provided between the pixel units, and the infrared light emitting unit is arranged on the pixel definition layer provided between the pixel units, and wherein cathodes of the infrared light emitting diode and the light emitting diode of one of the pixel units are arranged in a same layer, anodes of the infrared light emitting diode and the light emitting diode of one of the pixel units are arranged in a same layer, and light emitting layers of the infrared light emitting diode and the light emitting diode of one of the pixel units are made from different materials.

2. The display panel according to claim 1, wherein the display panel comprises a plurality of infrared light emitting units provided at different positions for emitting the infrared light towards the light exit side of the display panel.

3. The display panel according to claim 2, wherein the infrared light emitting units comprise pulse infrared light emitting units for emitting pulsed infrared light.

4. The display panel according to claim 1, wherein the infrared light emitting unit is a pulse infrared light emitting unit for emitting pulsed infrared light.

5. A display substrate having a light exit side, wherein the display substrate comprises:
- an infrared light emitting unit for emitting infrared light towards the light exit side of the display substrate; and
- at least three infrared light sensing units provided at different positions for detecting intensity of the infrared light emitted from the light exit side of the display substrate and reflected by a human eye,
wherein the display substrate further comprises a display area and a peripheral area surrounding the display area, the display area being provided with a plurality of pixel units spaced apart from each other,
wherein the infrared light emitting unit is arranged in the display area, and the infrared light sensing units are arranged in the peripheral area,
wherein the infrared light emitting unit arranged in the display area is located at an interval between adjacent pixel units,
wherein a black matrix is provided at a side of the infrared light emitting unit arranged in the display area adjacent to the light exit side,
wherein the display substrate is a light emitting diode display substrate, and the infrared light emitting unit is an infrared light emitting diode provided in the display area,
wherein each of the pixel units is provided with one light emitting diode for emitting light, a pixel definition layer is provided between the pixel units, and the infrared light emitting unit is arranged on the pixel definition layer provided between the pixel units, and
wherein cathodes of the infrared light emitting diode and the light emitting diode of one of the pixel units are arranged in a same layer, anodes of the infrared light emitting diode and the light emitting diode of one of the pixel units are arranged in a same layer, and light emitting layers of the infrared light emitting diode and the light emitting diode of one of the pixel units are made from different materials.

6. The display substrate according to claim 5, wherein the display substrate is an array substrate.

* * * * *